United States Patent [19]

Ohno et al.

[11] Patent Number: 5,315,205

[45] Date of Patent: May 24, 1994

[54] PIEZOELECTRIC VIBRATOR CAPABLE OF RELIABLY PREVENTING DIELECTRIC BREAKDOWN AND A METHOD OF MANUFACTURING THE SAME

[75] Inventors: Tomeji Ohno; Tetsuo Yoshida; Yoshiaki Fuda, all of Sendai, Japan

[73] Assignee: Tokin Corporation, Miyagi, Japan

[21] Appl. No.: 946,946

[22] Filed: Sep. 17, 1992

[30] Foreign Application Priority Data

Sep. 25, 1991 [JP] Japan ................................. 3-271913
Nov. 5, 1991 [JP] Japan ................................. 3-288489
Feb. 12, 1992 [JP] Japan ................................. 4-025093

[51] Int. Cl.⁵ .......................................... H01L 41/04
[52] U.S. Cl. ................................... 310/357; 310/328; 310/331; 310/366
[58] Field of Search ............... 310/331, 358, 359, 366, 310/323, 328

[56] References Cited

U.S. PATENT DOCUMENTS

| | | | |
|---|---|---|---|
| 3,175,107 | 3/1965 | Brussaard et al. | 310/358 |
| 4,376,302 | 3/1983 | Miller | 310/358 |
| 4,692,652 | 9/1987 | Seki et al. | 310/328 |
| 4,780,639 | 10/1988 | Shinasu | 310/358 |

FOREIGN PATENT DOCUMENTS

| | | | |
|---|---|---|---|
| 0408305A2 | 1/1991 | European Pat. Off. | H01L 41/09 |
| 1144793 | 3/1963 | Fed. Rep. of Germany | 310/358 |
| 0072171 | 4/1988 | Japan | 310/358 |
| 0072172 | 4/1988 | Japan | 310/358 |

OTHER PUBLICATIONS

Patent Abstracts of Japan, vol. 15, No. 277 (E-1089), Jul. 15, 1991 & JP-A-30 94 487 (Murata Mfg. Co., Ltd.) Apr. 19, 1991.
Patent Abstracts of Japan, vol. 12, No. 304 (E-646), Aug. 18, 1988 & JP-A-63 072 172 (NGK Spark Plug Co.).
Patent Abstracts of Japan, vol. 12, No. 304 (E-646), Aug. 18, 1988 & JP-A-63 972 171 (NGK Spark Plug Co.).

*Primary Examiner*—Thomas M. Dougherty
*Attorney, Agent, or Firm*—Frishauf, Holtz, Goodman & Woodward

[57] ABSTRACT

On a first piezoelectric sheet of a piezoelectric vibrator, a second piezoelectric sheet is stacked with interposition, between the sheets, of first-set electrodes (24(1), 24(2)) formed on an upper surface of the first piezoelectric sheet. Second-set electrodes are formed on an upper surface of the second piezoelectric sheet with each placed halfway between two adjacent ones of the first-set electrodes. The second piezoelectric sheet is poled in directions from each second-set electrode to the two adjacent ones of the first-set electrodes. Preferably, third-set electrodes are formed on a lower surface of the first piezoelectric sheet with each arranged halfway between two adjacent ones of the first-set electrodes. In this event, the first piezoelectric sheet is poled in directions from each third-set electrode to two adjacent ones of the first-set electrodes. Each first-set electrode has a first end along a side surface of the first piezoelectric sheet with each second-set and each third-set electrode possessed of a second and a third end along opposite side surfaces of the first and the second piezoelectric sheets. First and second common outside electrodes are formed on such side surfaces in contact with the first end of each first-set electrode either directly or through a first common electrode and in contact with the second and the third ends of the second-set and the third-set electrodes either directly or through second and third common electrodes.

7 Claims, 10 Drawing Sheets

PIEZOELECTRIC VIBRATOR CAPABLE OF RELIABLY PREVENTING DIELECTRIC BREAKDOWN AND A METHOD OF MANUFACTURING THE SAME

BACKGROUND OF THE INVENTION

The present invention relates to a piezoelectric vibrator or actuator which comprises a plurality of stacked or piled piezoelectric sheets. It is known that the piezoelectric vibrator can convert electric energy into mechanical vibration or energy and can convert the mechanical vibration or energy into the electric energy.

A conventional piezoelectric vibrator comprises a plurality of stacked piezoelectric sheets each of which has an upper surface, a plurality of first-set elongated electrodes on the upper surface in parallel, and a plurality of second-set electrodes on the upper surface in parallel. Each of the second-set elongated electrodes is arranged halfway between two adjacent ones of the first-set elongated electrodes. As will later be described more in detail, the conventional piezoelectric vibrator is incapable of reliably preventing dielectric breakdown of the piezoelectric sheets.

SUMMARY OF THE INVENTION

It is therefore an object of this invention to provide a piezoelectric vibrator which can reliably prevent undesirable dielectric breakdown.

Other objects of this invention will become clear as the description proceeds.

According to an aspect of this invention, there is provided a piezoelectric vibrator which comprises a first piezoelectric sheet having a first upper and a first lower surface, a plurality of first-set elongated electrodes on the first upper surface in parallel, a second piezoelectric sheet having a second upper and a second lower surface, and a plurality of second-set elongated electrodes on the second upper surface in parallel, the second piezoelectric sheet being piled on the first piezoelectric sheet with the first upper surface placed adjacent to the second lower surface and with each of the second-set elongated electrodes arranged halfway between two adjacent ones of the first-set elongated electrodes, wherein the second piezoelectric sheet is polarized in directions from each of the second-set elongated electrodes to two adjacent ones of the first-set elongated electrodes.

According to another aspect to this invention, there is provided a piezoelectric vibrator which comprises a first piezoelectric sheet having a first upper and a first lower surface, a plurality of first-set elongated electrodes on the first upper surface in parallel, a second piezoelectric sheet having a second upper and a second lower surface, a plurality of second-set elongated electrodes on the second upper surface in parallel, and a plurality of third-set elongated electrodes on the first lower surface in parallel, each of the third-set elongated electrodes being arranged halfway between two adjacent ones of the first-set elongated electrodes, the second piezoelectric sheet being piled on the first piezoelectric sheet with the first upper surface placed adjacent to the second lower surface and with each of the second-set elongated electrodes arranged halfway between two adjacent ones of the first-set elongated electrodes, wherein the first piezoelectric sheet is polarized in directions from each of the third-set elongated electrodes to two adjacent ones of the first-set elongated electrodes, the second piezoelectric sheet being polarized in directions from each of the second-set elongated electrodes to two adjacent ones of the first-set elongated electrodes.

According to still another aspect to this invention, there is provided a method for manufacturing a piezoelectric vibrator and which comprises the steps of: preparing a first piezoelectric sheet having a first upper surface and a first lower surface; preparing a second piezoelectric sheet having a second upper surface and a second lower surface; forming first-set elongated electrodes on the first upper surface in parallel; forming second-set elongated electrodes on the second upper surface in parallel; piling the second piezoelectric sheet on the first piezoelectric sheet with the first upper surface placed adjacent to the second lower surface and with each of the second-set elongated electrodes arranged halfway between two adjacent ones of the first-set elongated electrodes; sintering the first and the second piezoelectric sheets on which the first-set and the second-set elongated electrodes are formed; and polarizing the second piezoelectric sheet in directions from each of the second-set elongated electrodes to two adjacent ones of the first-set elongated electrodes.

According to yet another aspect of this invention, there is provided a method for manufacturing a piezoelectric vibrator and which comprises the steps of: preparing a first piezoelectric sheet having a first upper surface and a first lower surface; preparing a second piezoelectric sheet having a second upper and a second lower surface; forming first-set elongated electrodes on the first upper surface in parallel; forming second-set elongated electrodes on the second upper surface in parallel; forming third-set elongated electrodes on the first lower surface in parallel with each of the third-set elongated electrodes arranged halfway between two adjacent ones of the first-set elongated electrodes; piling the second piezoelectric sheet on the first piezoelectric sheet with the first upper surface placed adjacent to the second lower surface and with each of the second-set elongated electrodes arranged halfway between two adjacent ones of the first-set elongated electrodes; sintering the first and the second piezoelectric sheets on which the first-set, the second-set, and the third-set elongated electrodes are formed; polarizing the first piezoelectric sheet in directions from each of the third-set elongated electrodes to two adjacent ones of the first-set elongated electrodes; and polarizing the second piezoelectric sheet in directions from each of the second-set elongated electrodes to two adjacent ones of the first-set elongated electrodes.

DESCRIPTION OF THE PREFERRED EMBODIMENTS

Figure 1:
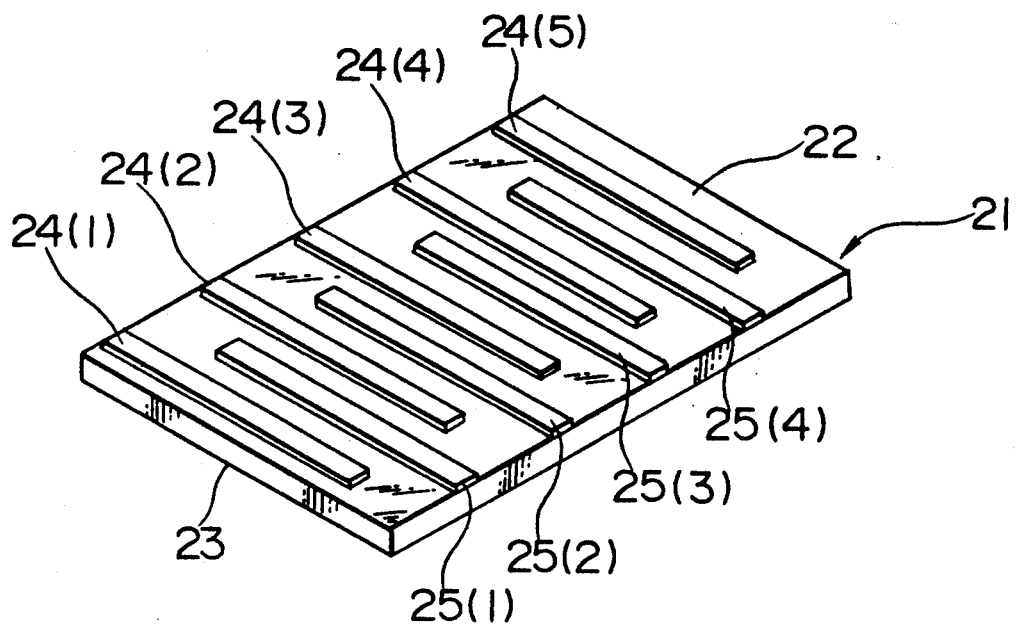
FIG. 1 is a perspective view of a part of a conventional piezoelectric vibrator.
Figure 2:
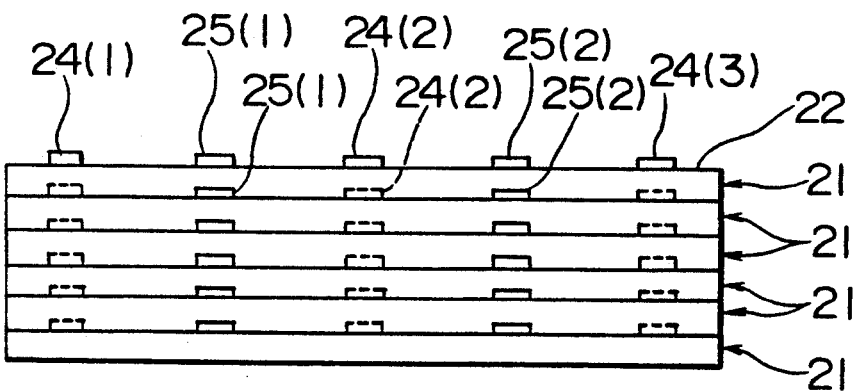
FIG. 2 is a front view of the conventional piezoelectric vibrator which is partly illustrated in FIG. 1.

Referring to FIGS. 1 and 2, a conventional piezoelectric vibrator will first be described for a better understanding of this invention. The conventional vibrator comprises a plurality of piezoelectric sheets 21. Each of the piezoelectric sheets 21 has an upper surface 22 and a lower surface 23. A plurality of first-set elongated electrodes 24(1), 24(2), 24(3), 24(4), and 24(5) are formed on the upper surface 22 in parallel.

A plurality of second-set elongated electrodes 25(1), 25(2), 25(3), and 25(4) are formed on the upper surface 22 in parallel to the first-set elongated electrodes 24 (suffixes omitted). Each of the second-set elongated electrodes 25 (suffixes omitted) is arranged halfway between two adjacent ones of the first-set elongated electrodes 24. The piezoelectric sheets 21 are piled or stacked with the upper surface 22 of a first one of the piezoelectric sheets 21 placed adjacent to the lower surface 23 of a second one of the piezoelectric sheets 21.

Referring more particularly to FIG. 2, it is seen that the first-set and the second-set elongated electrodes 24 and 25 are interposed between the lower surface 23 of the first one of the piezoelectric sheets 21 and the upper surface 22 of the second one of the piezoelectric sheets 21. Furthermore, the first-set and the second-set electrodes 24 and 25 of the stacked piezoelectric sheets 21 are arranged in rows and columns of a matrix.

Figure 3:
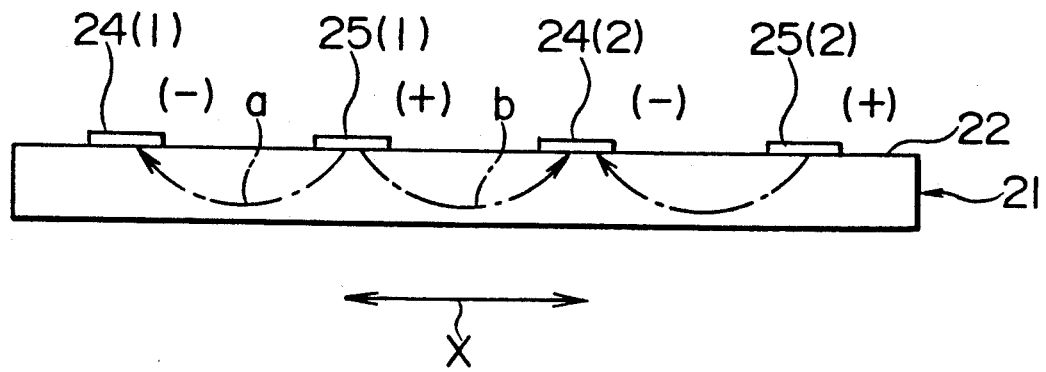
FIG. 3 schematically shows a partial section of the conventional piezoelectric vibrator illustrated in FIGS. 1 and 2.

Referring to FIG. 3, each of the piezoelectric sheets 21 is polarized from each of the second-set elongated electrodes 25 to two adjacent ones of the first-set electrodes 24 in directions indicated by dash-dot lines a and b with arrowheads. When the second-set elongated electrodes 25 and the first-set elongated electrodes 24 are applied with a direct current driving voltage, the piezoelectric sheets 21 are expanded and contracted. It will be presumed in the manner indicated by plus and minus signs adjacent to the electrodes 24 and 25 that the second-set elongated electrodes 25 are applied with a positive voltage and the first-set elongated electrodes 24 are applied with a negative voltage. In this event, the piezoelectric sheets 21 are expanded in a direction shown at x. Inasmuch as the first-set elongated electrodes 24 and the second-set elongated electrodes 25 are formed on the upper surface 22 and applied with voltages of different polarity, dielectric breakdown is liable to undesirably occur in the piezoelectric sheets 21.

Figure 4:
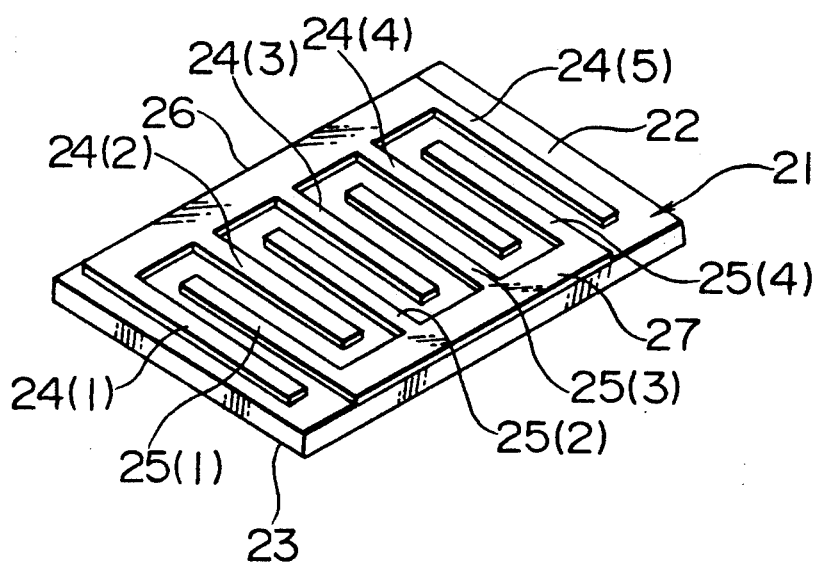
FIG. 4 is a perspective view of a part of another conventional piezoelectric vibrator.

Referring to FIG. 4, another conventional piezoelectric vibrator further comprises a first common electrode 26 and a second common electrode 27 on the upper surface 22. The first common electrode 26 is for connecting the first-set elongated electrodes 24 together. Similarly, the second common electrode 27 is for connecting the second-set elongated electrodes 25 together. When the first common electrode 26 and the second common electrode 27 are applied with the direct current driving voltage, a voltage between the first-set elongated electrodes 24 and the second common electrode 27 and a voltage between the second-set elongated electrodes 25 and the first common electrode 26 prevent the piezoelectric sheets 21 from desiredly expanding and contracting.

Figure 5:
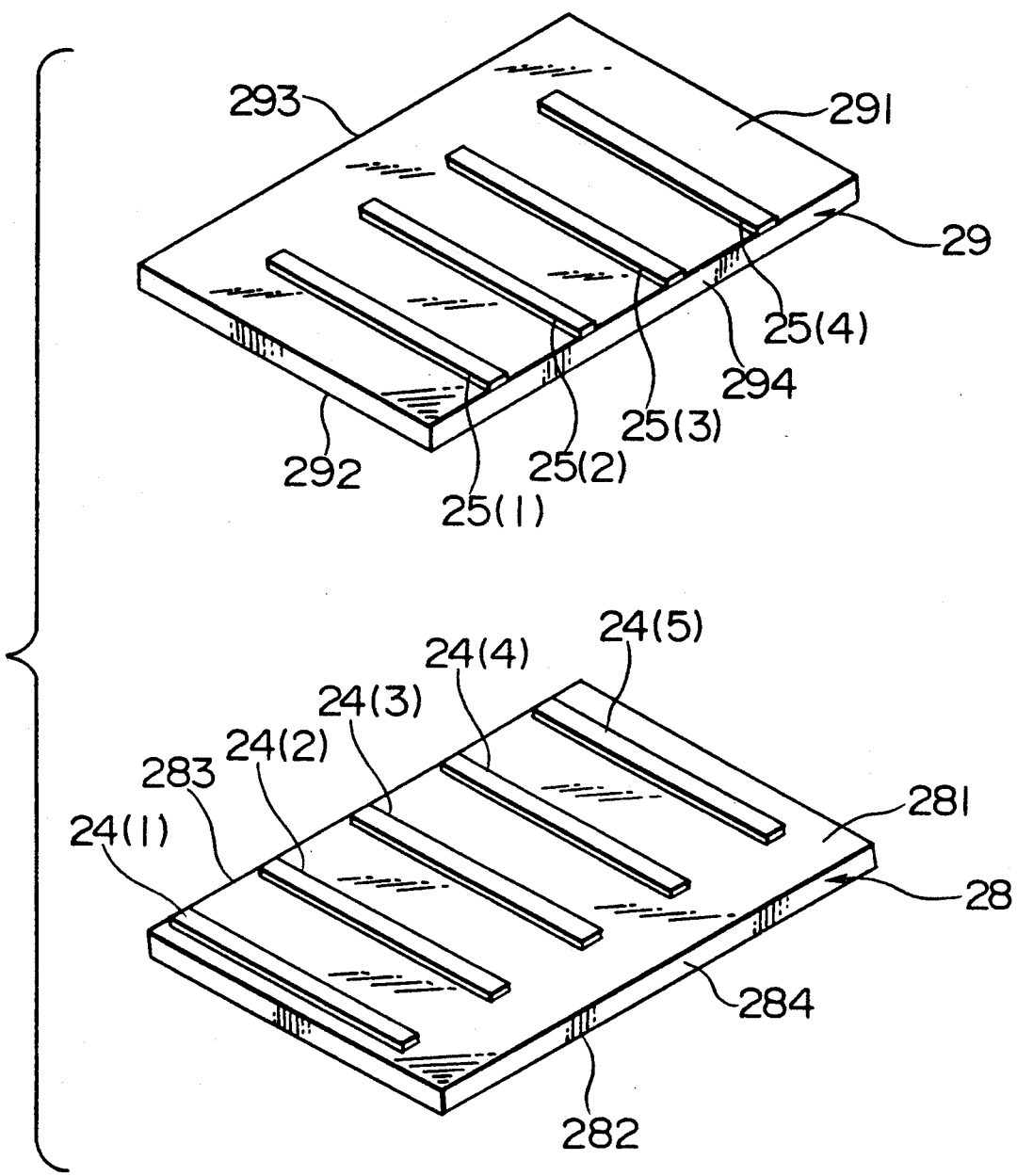
FIG. 5 is an exploded perspective view of a piezoelectric vibrator according to a first embodiment of this invention.
Figure 6:
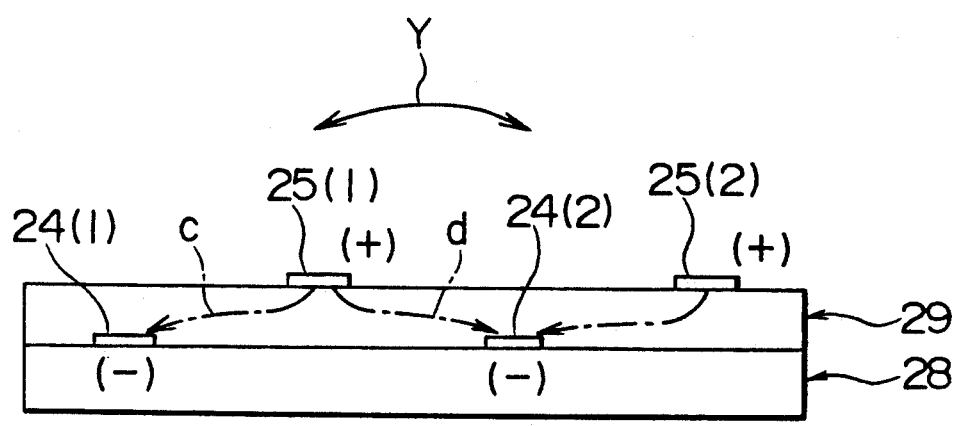
FIG. 6 schematically shows a partial section of the piezoelectric vibrator illustrated in FIG. 5.

Referring now to FIGS. 5 and 6, the description will proceed to a piezoelectric vibrator according to a first embodiment of this invention. Similar parts are designated by like reference numerals.

In FIG. 5, a first piezoelectric sheet 28 has a first upper surface 281, a first lower surface 282, a first primary side surface 283, and a first secondary side surface 284. A second piezoelectric sheet 29 has a second upper surface 291, a second lower surface 292, a second primary side surface 293, and a second secondary side surface 294.

The first-set elongated electrodes 24 are formed on the first upper surface 281 in parallel. Each of the first-set elongated electrodes 24 has a first electrode end at the first primary side surface 283. The second-set elongated electrodes 25 are formed on the second upper surface 291 in parallel. Each of the second-set elongated electrodes 25 has a second electrode end at the second secondary surface 294.

The second piezoelectric sheet 29 is piled or stacked on the first piezoelectric sheet 28 with the first upper surface 281 placed adjacent to the second lower surface 292. The first and the second primary side surfaces 283 and 293 are coplanar. The first and the second secondary side surfaces 284 and 294 are similarly coplanar. The first-set elongated electrodes 24 are interposed between the first upper surface 281 and the second lower surface 292. The second-set elongated electrodes 25 are arranged in parallel with the first-set elongated electrodes 24. Each of the second-set elongated electrodes 25 is arranged halfway between two adjacent ones of the first-set elongated electrodes 24.

In FIG. 6, the second piezoelectric sheet 29 is polarized or poled from each of the second-set elongated electrodes 25 to two adjacent ones of the first-set elongated electrodes 24 in directions indicated by dash-dot lines c and d with arrowheads. The first piezoelectric sheet 28 is not polarized in the example being illustrated.

When the second-set elongated electrodes 25 and the first-set elongated electrodes 24 are applied with the direct current driving voltage, the second piezoelectric sheet 29 is expanded or contracted. The first piezoelectric sheet 28 is not expanded or contracted. When the second-set elongated electrodes 25 are applied with the voltage of the positive polarity as indicated by plus signs with the first-set elongated electrodes 24 applied with the voltage of the negative polarity as indicated by minus signs, the first and the second piezoelectric sheets 28 and 29 are bent in the manner indicated by an arcuate line Y with bidirectional arrowheads.

The first-set elongated electrodes 24 are placed below the second lower surface 292 and the second-set elongated electrodes 25 are formed on the second upper surface 291 The second-set elongated electrodes 25 are applied with the voltage of the positive polarity with the first-set elongated electrodes 24 applied with the voltage of the negative polarity. Thus, the second piezoelectric sheet 29 is between the first-set elongated electrodes 24 and the second-set elongated electrodes 25 which are applied with voltages of different polarity, respectively. Also, the first-set elongated electrodes 24 below the second lower surface 292 are applied with voltage of a negative polarity, namely, the same polarity. The second-set elongated electrodes 25 formed on the second upper surface 291 are applied with voltage of a positive polarity, namely, the same polarity. Consequently, piezoelectric vibrator reliably prevents undesirable dielectric breakdown of the second piezoelectric sheet 29.

Figure 7:
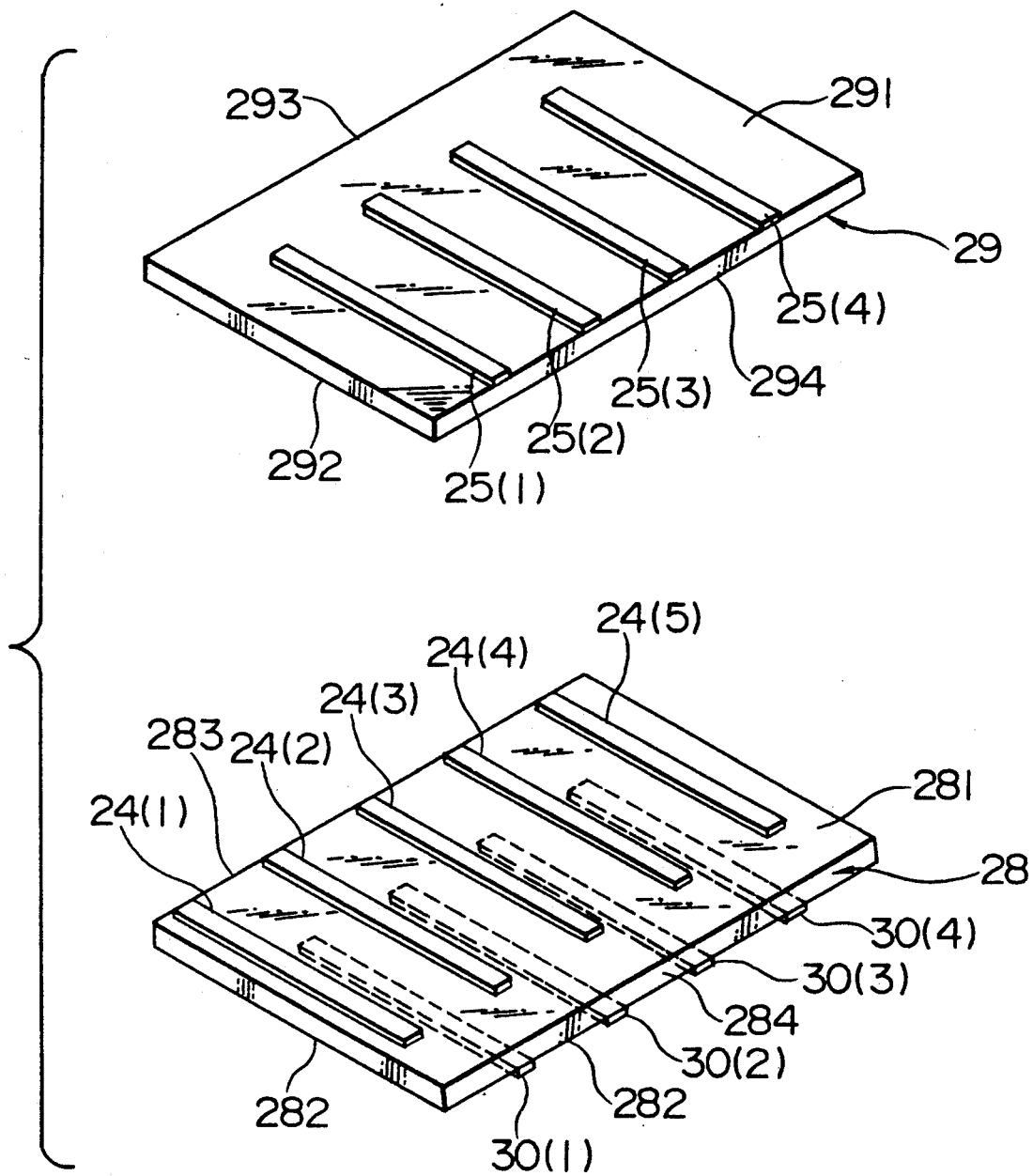
FIG. 7 is an exploded perspective view of a piezoelectric vibrator according to a second embodiment of this invention.
Figure 8:
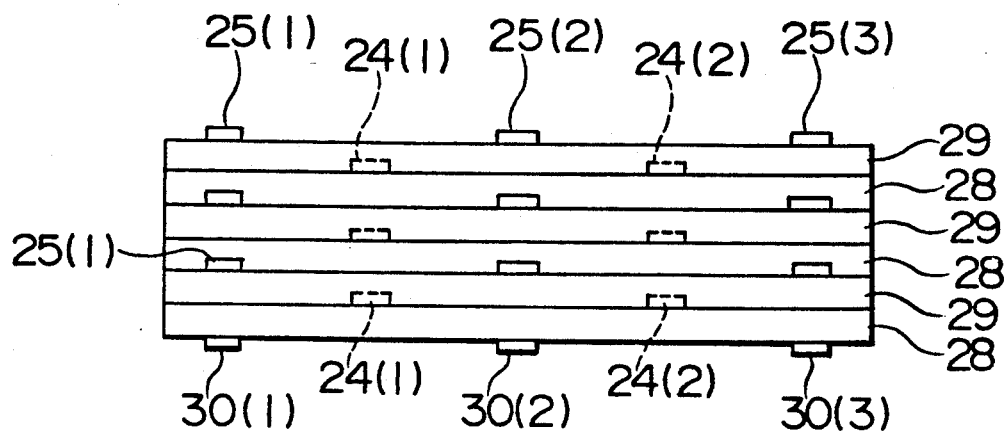
FIG. 8 is a front view of a principal part of the piezoelectric vibrator illustrated in FIG. 7.
Figure 9:
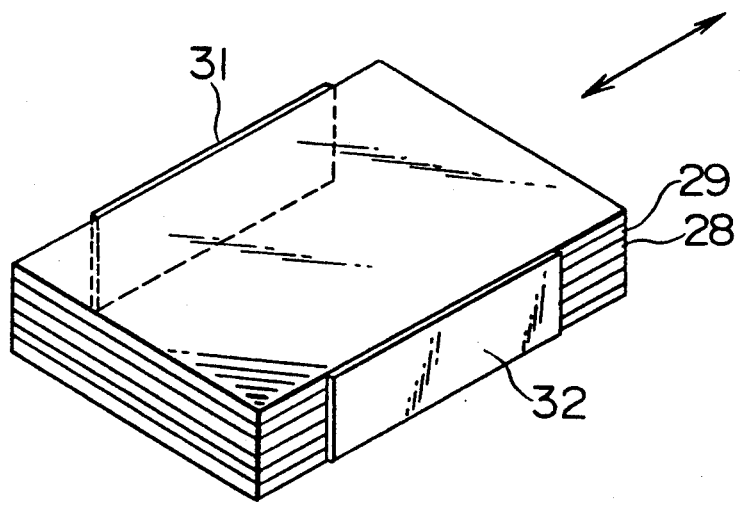
FIG. 9 is a perspective view of the piezoelectric vibrator illustrated in FIGS. 7 and 8.

Referring to FIGS. 7 to 9, the description will proceed to a piezoelectric vibrator according to a second embodiment of this invention. Similar parts are designated by like reference numerals.

In FIG. 7, third-set elongated electrodes 30(1), 30(2), 30(3), and 30(4) are formed on the first lower surface 282. The third-set elongated electrodes 30 are arranged in parallel with the first-set elongated electrodes 24. Each of the third-set elongated electrodes 30 (suffixes omitted) is arranged halfway between two adjacent ones of the first-set elongated electrodes 24. Each of the third-set elongated electrodes 30 has a third electrode end at the first secondary side surface 284.

In FIG. 8, the first and the second piezoelectric sheets 28 and 29 are piled or stacked on one another into a stack of piezoelectric sheets. It will be understood that one of the second piezoelectric sheets, such as 29, is stacked atop of the stack with its second-set elongated electrodes 25 exposed. The lowest one of the stacked piezoelectric sheets 28 and 29 is the first piezoelectric sheet 28 having the third-set elongated electrodes 30 exposed.

In FIG. 9, a first common outside electrode 31 is formed on the first primary and the second primary side surfaces 283 and 293 and connected to the first electrode end of each of the first-set elongated electrodes 24. A second common outside electrode 32 is formed on the first secondary and the second secondary surfaces 284 and 294 and connected to the second electrode end of each of the second-set elongated electrodes 25. The first-set elongated electrodes 24 and the second-set elongated electrodes 25 are applied with the direct current driving voltage through the first and the second common outside electrodes 31 and 32.

Figure 10:
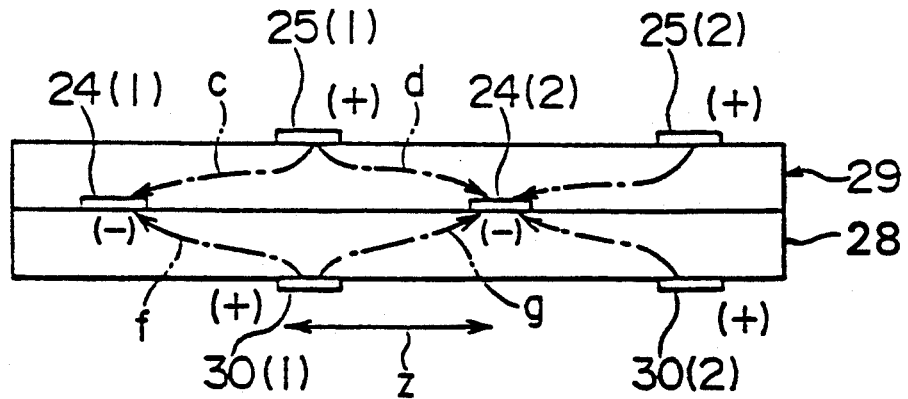
FIG. 10 schematically shows a partial section of the piezoelectric vibrator illustrated in FIGS. 7 and 8.

In FIG. 10, the second piezoelectric sheet 29 is polarized from each of the second-set elongated electrodes 25 to two adjacent ones of the first-set elongated electrodes 24 in the directions indicated by dash-dot lines c and d with arrowheads. The first piezoelectric sheet 28 is polarized from each of the third-set elongated electrodes 30 to two adjacent ones of the first-set elongated electrodes 24 in directions indicated by dash-dot lines f and g with arrowheads.

When the first-set, the second-set, and the third-set elongated electrodes 24, 25, and 30 are applied with the direct current driving voltage, the first and the second piezoelectric sheets 28 and 29 are expanded or contracted. When the second-set and the third-set elongated electrodes 25 and 30 are applied with the voltage of the positive polarity as indicated by plus signs with the first-set elongated electrodes 24 applied with the voltage of the negative polarity as indicated by minus signs, the first and the second piezoelectric sheets 28 and 29 are expanded in a direction indicated by a line Z with bidirectional arrowheads.

In the piezoelectric vibrator, such as illustrated with reference to FIGS. 5 and 6 or FIGS. 7 through 10, each of the first and the second piezoelectric sheets 28 and 29 has a thickness between 50 and 200 microns. Each of the first-set, the second-set, and the third-set elongated electrodes 24, 25, and 30 may be 2 to 10 microns thick and 50 to 60 microns wide. Electrodes 24, 25, and 30 of the first-set, the second-set, and the third-set elongated electrodes 24, 25, and 30 may be from 100 to 600 microns spaced apart on the piezoelectric sheets 28 and 29. The direct current driving voltage may have an absolute value which is not higher than 300 V.

Figure 11:
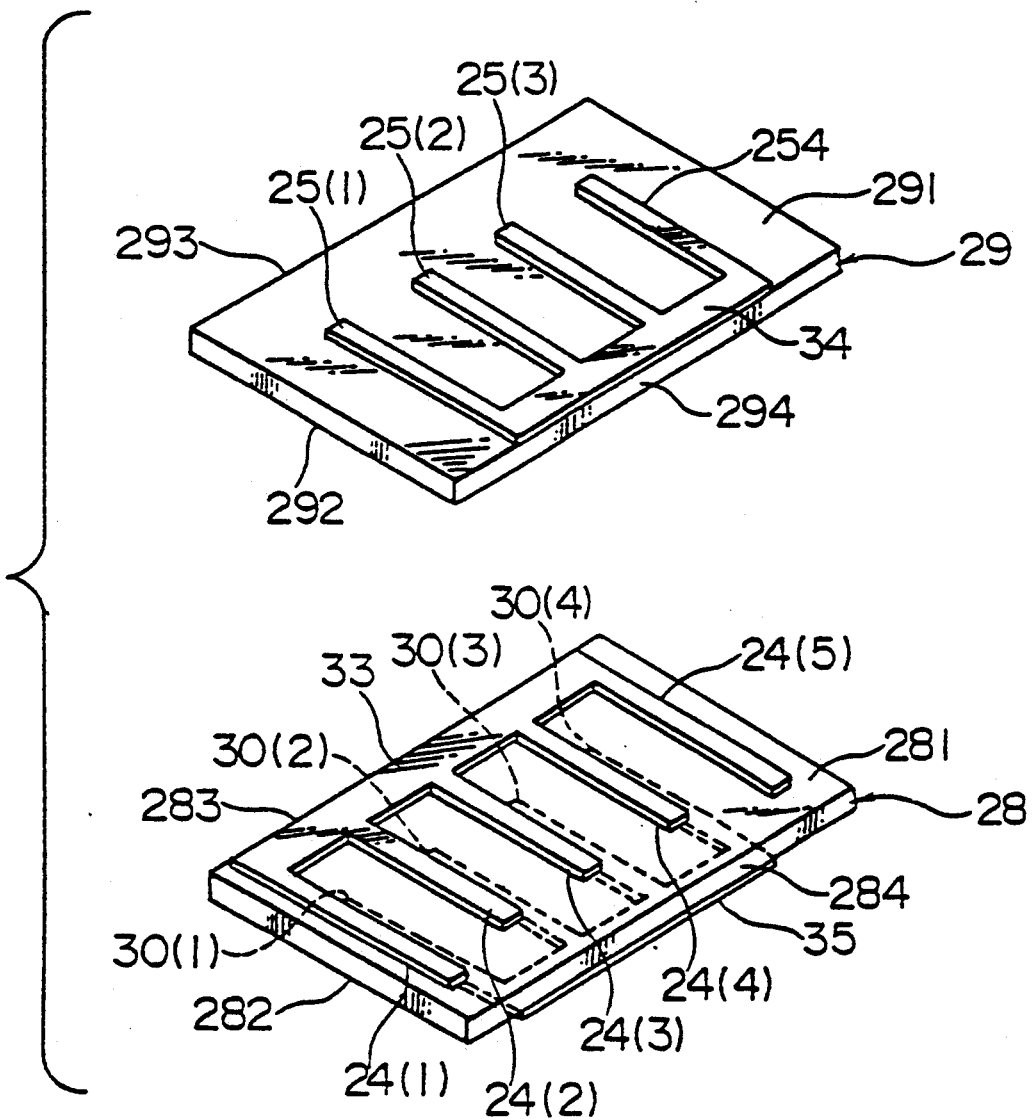
FIG. 11 is an exploded perspective view of a piezoelectric vibrator according to a third embodiment of this invention.
Figure 12:
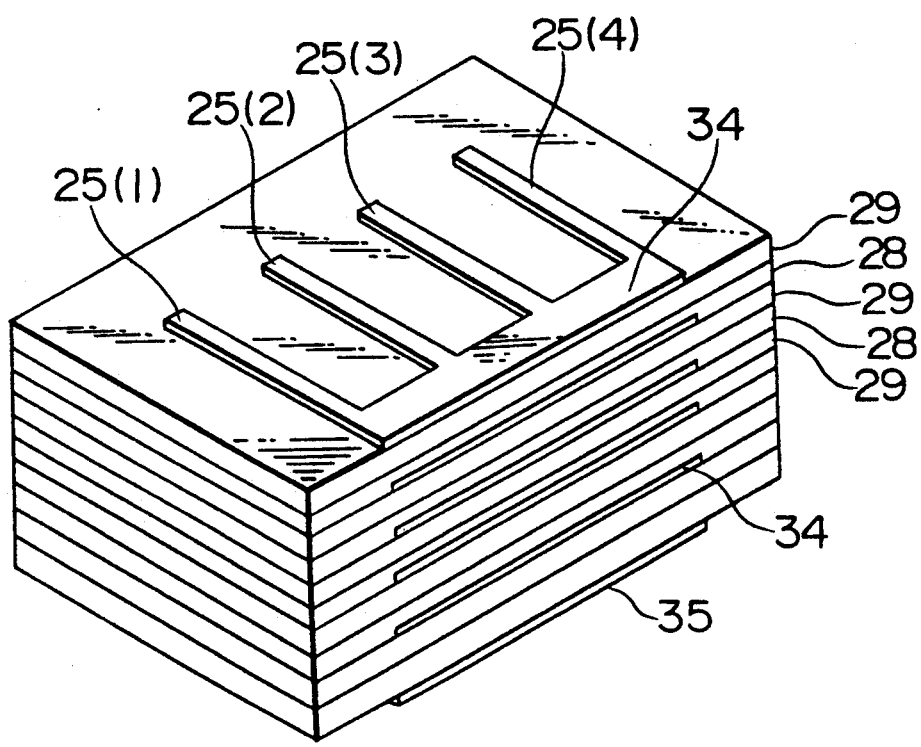
FIG. 12 is a perspective view of a principal part of the piezoelectric vibrator illustrated in FIG. 11.

Referring to FIGS. 11 and 12, the description will proceed to a piezoelectric vibrator according to a third embodiment of this invention. Similar parts are designated by like reference numerals.

In FIG. 11, a first common electrode 33 is formed on the first upper surface 281 contiguous to the first primary side surface 283 and connected to the first-set elongated electrodes 24. A second common electrode 34 is formed on the second upper surface 291 along the second secondary side surface 294 and connected to the second-set elongated electrodes 25. Like in the piezoelectric vibrator illustrated with reference to FIGS. 7 through 10, the third-set elongated electrodes 30 are formed on the first lower surface 282 of the first piezoelectric sheet 28. A third common electrode 35 is formed on the first lower surface 282 adjacent to the first secondary side surface 284 and connected to the third-set electrodes 30.

In FIG. 12, the first and the second piezoelectric sheets 28 and 29 are piled or stacked on one another. The first common electrode 33 (FIG. 11) is connected to the first common outside electrode 31 (FIG. 9). The second and the third common electrodes 34 and 35 are connected to the second common outside electrode 32 (FIG. 9).

Figure 13:
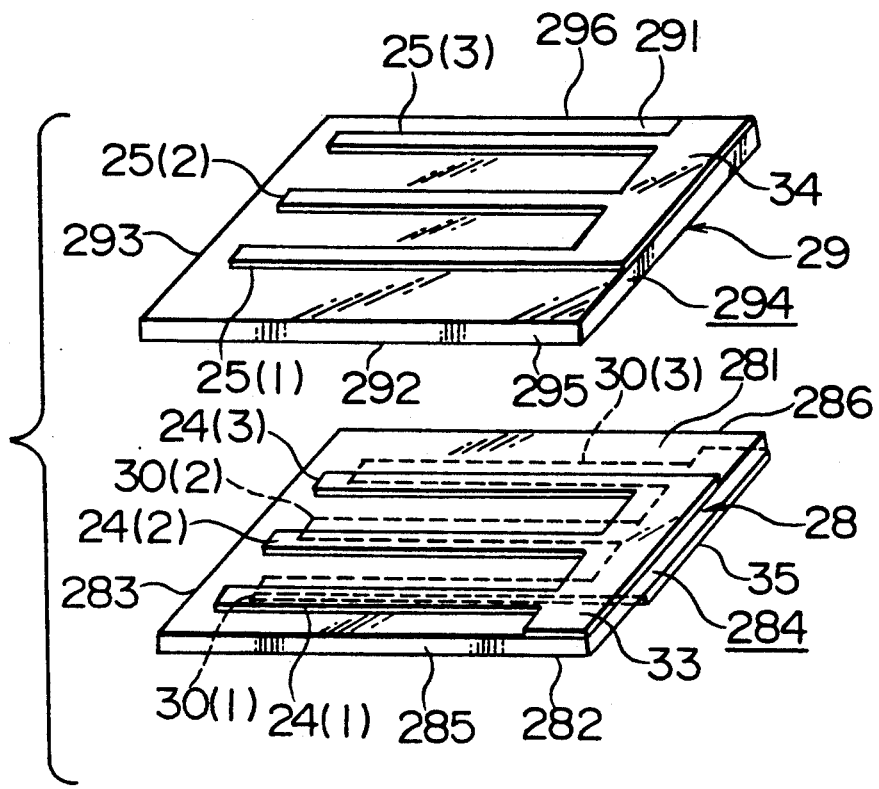
FIG. 13 is an exploded perspective view of a piezoelectric vibrator according to a fourth embodiment of this invention.
Figure 14:
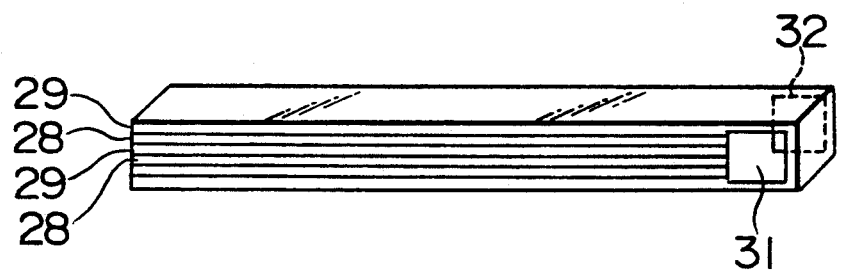
FIG. 14 is a perspective view of the piezoelectric vibrator illustrated in FIG. 13.

Referring to FIGS. 13 and 14, the description will proceed to a piezoelectric vibrator according to a fourth embodiment of this invention. Similar parts are designated by like reference numerals.

In FIG. 13, the first piezoelectric sheet 28 further has a first ternary side surface 285 and a first quaternary side surface 286. The second piezoelectric sheet 29 further has a second ternary side surface 295 and a second quaternary side surface 296. The first common electrode 28 is formed on the first upper surface 281 along the first secondary side surface 284 to reach the ternary side surface 285. The second common electrode 34 is formed on the second upper surface 291 contiguous to the second secondary side surface 294 to reach the second quaternary side surface 296.

In FIG. 14, such piezoelectric sheets, such as 28 and 29, are piled or stacked on one another in the manner described before in conjunction with FIGS. 8 and 12. The first and the second ternary side surfaces 285 and 295 are arranged coplanar with the first and the second quaternary side surfaces 286 and 296 disposed coplanar.

The first common electrode 33 is formed along the first secondary side surface 284 to have a first electrode end on the first ternary side surface 285. The second common electrode 34 is formed along the second secondary side surface 294 to have a second electrode end on the second quaternary side surface 296. The third common electrode 35 is formed adjacent the first secondary side surface 284 to have a third electrode end on the first quaternary side surface 286. The first common outside electrode 31 is formed on the first and the second ternary side surfaces 285 and 295 and connected to the first common electrode 33 at the first electrode end. The second common outside electrode 32 is formed on the first and the second quaternary side surfaces 286 and 296 and connected to the second electrode end of the second common electrode 34 and the third electrode end of the third common outside electrode 35. As a result, a voltage between the first-set elongated electrodes 24 and the second common electrode 34 and a voltage between the second-set elongated electrodes 25 and the first common electrode 33 do not prevent the first and the second piezoelectric sheets 28 and 29 from desirably expanding and contracting.

Figure 15:
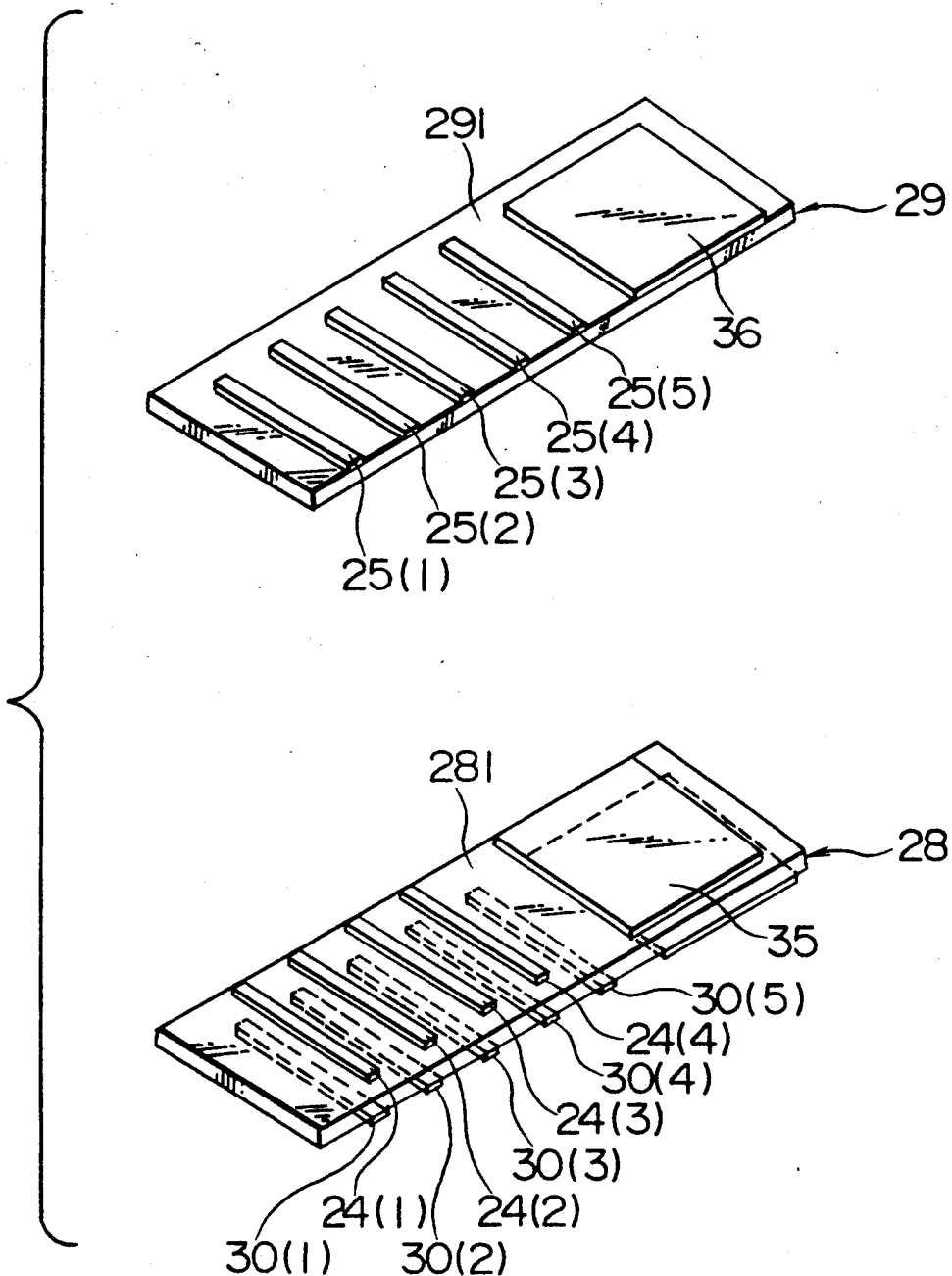
FIG. 15 is a perspective view of a piezoelectric vibrator according to a fifth embodiment of this invention.

Referring to FIG. 15, the description will proceed to a piezoelectric vibrator according to a fifth embodiment of this invention. Similar parts are designated by like reference numerals. A first detecting electrode 35 is formed on the first upper surface 281 of the first piezoelectric sheet 28. A second detecting electrode 36 is formed on the second upper surface 291 of the second piezoelectric sheet 29. The first and the second detecting electrodes 35 and 36 are for detecting a stress which appears in the second piezoelectric sheet 29 when a potential difference is supplied between the first-set elongated electrodes 24 and the second-set elongated electrodes 25.

Referring back to FIG. 5, the description will proceed to a method of manufacturing the piezoelectric vibrator. The first piezoelectric sheet 28 was prepared in the known manner to have the first upper surface 281 and the first lower surface 282. The second piezoelectric sheet 29 was prepared to have the second upper surface 291 and the second lower surface 292. The first-set elongated electrodes 24 were formed by screen printing on the first upper surface 281 in parallel. The second-set elongated electrodes 25 were screen-printed on the second upper surface 291 in parallel The second piezoelectric sheet 29 was piled or stacked on the first piezoelectric sheet 28 with the first upper surface 281 placed adjacent to the second lower surface 292 and with each of the second-set elongated electrodes 25 arranged halfway between two adjacent ones of the first-set elongated electrodes 24. The first and the second piezoelectric sheets 28 and 29 were sintered together with the first-set and the second-set elongated electrodes 24 and 25 in the manner known in the art.

A voltage of 300 to 500 V was applied during 10 to 60 minutes between the first-set and the second-set elongated electrodes 24 and 25. The second piezoelectric sheet 29 was polarized in the directions from each of the second-set elongated electrodes 25 to two adjacent ones of the first-set elongated electrodes 24.

Referring back to FIG. 7, the description will proceed to a different method of manufacturing the piezoelectric vibrator. The different method is similar to the method described above in connection with FIG. 5 and is different in the following respects.

The third-set elongated electrodes 30 were formed on the first lower surface 282 in parallel with each of the third-set elongated electrodes 30 arranged halfway between two adjacent ones of the first-set elongated electrodes 24.

A voltage of 300 to 500 V was additionally applied during 10 to 60 minutes between the first-set and the third-set elongated electrodes 24 and 30. The first piezoelectric sheet 28 was polarized in the directions from each of the third-set elongated electrodes 30 to two adjacent ones of the first-set elongated electrodes 24.

What is claimed is:

1. A piezoelectric vibrator comprising:
   a first piezoelectric sheet having a first upper and a first lower surface,
   a second piezoelectric sheet having a second upper and a second lower surface, said second piezoelectric sheet being piled on said first piezoelectric sheet with said first upper surface of said first piezoelectric sheet placed adjacent to said second lower surface of said second piezoelectric sheet,
   a plurality of elongated electrodes consisting essentially of:
      a plurality of parallel first-set elongated electrodes on said first upper surface of said first piezoelectric sheet, and
      a plurality of second-set elongated electrodes on said second upper surface in parallel with said first-set elongated electrodes, each of said second-set elongated electrodes being arranged halfway between two adjacent ones of said first-set elongated electrodes; and
   said second piezoelectric sheet being polarized in a direction from each of said second-set elongated electrodes to said two adjacent ones of said first-set elongated electrodes.

2. A piezoelectric vibrator comprising:
   a first piezoelectric sheet having a first upper and a first lower surface,
   a second piezoelectric sheet having a second upper and a second lower surface, said second piezoelectric sheet being piled on said first piezoelectric sheet with said first upper surface of said first piezoelectric sheet placed adjacent to said second lower surface of said second piezoelectric sheet,
   a plurality of elongated electrodes consisting essentially of:
      a plurality of parallel first-set elongated electrodes on said first upper surface
      a plurality of second-set elongated electrodes on said second upper surface in parallel with said first-set elongated electrodes, each of said second-set elongated electrodes arranged halfway between two adjacent ones of said first-set elongated electrodes, and
      a plurality of third-set elongated electrodes on said first lower surface in parallel with said first-set elongated electrodes, each of said third-set elongated electrodes being arranged halfway between two adjacent ones of said first-set elongated electrodes,
   said first piezoelectric sheet being polarized in a direction from each of said third-set elongated electrodes to said two adjacent ones of said first-set elongated electrodes, and said second piezoelectric sheet being polarized in a direction from each of said second-set elongated electrodes to said two adjacent ones of said first-set elongated electrodes.

3. A piezoelectric vibrator as claimed in claim 2, further comprising:

a first common electrode on said first upper surface for connecting said first-set elongated electrodes; and a second common electrode on said second upper surface for connecting said second-set elongated electrodes.

4. A piezoelectric vibrator as claimed in claim 3, wherein said first piezoelectric sheet further has a first primary side surface and a first secondary side surface, said second piezoelectric sheet further has a second primary side surface adjacent to said first primary side surface and a second secondary side surface adjacent to said first secondary side surface when said second piezoelectric sheet is piled on said first piezoelectric sheet, said first common electrode is formed on said first upper surface adjacent to said first primary side surface, and said second common electrode is formed on said second upper surface adjacent to said second secondary side surface.

5. A piezoelectric vibrator as claimed in claim 3, wherein said first piezoelectric sheet further has a first primary side surface and a first secondary side surface, said second piezoelectric sheet further has a second primary side surface adjacent to said first primary side surface and a second secondary side surface adjacent to said first secondary side surface when said second piezoelectric sheet is piled on said first piezoelectric sheet, said first common electrode is formed on said first upper surface to reach said first primary side surface, said second common electrode is formed on said second upper surface to reach said second secondary side surface, and said piezoelectric vibrator further comprises:

a first common outside electrode formed on said first primary and said second primary side surfaces and connected to said first common electrode; and a second common outside electrode formed on said second secondary and first secondary side surfaces and connected to said second common electrode.

6. A piezoelectric vibrator as claimed in claim 2, wherein said first piezoelectric sheet further has a first primary side surface and a first secondary side surface, said second piezoelectric sheet further has a second primary side surface adjacent to said first primary side surface and a second secondary side surface adjacent to said first secondary side surface when said second piezoelectric sheet is piled on said first piezoelectric sheet, said first-set elongated electrodes have first-set electrode ends at said first primary side surface, said second-set elongated electrodes have second-set electrode ends at said second secondary side surface, and said piezoelectric vibrator further comprises:

a first common outside electrode formed on said first primary and said second primary side surfaces and connected to said first-set electrode ends; and a second common outside electrode formed on said first secondary and said second secondary side surfaces and connected to said second-set electrode ends.

7. A piezoelectric vibrator as claimed in claim 2, further comprising:

first detecting electrode means on said first upper surface for detecting a stress which appears in said second piezoelectric sheet when a potential difference is supplied between said first-set elongated electrodes and said second-set elongated electrodes; and a second detecting electrode means on said second upper surface for detecting said stress.

* * * * *